US011289617B2

United States Patent
Shi et al.

(10) Patent No.: US 11,289,617 B2
(45) Date of Patent: Mar. 29, 2022

(54) METHOD OF INTERCONNECTING SHINGLED PV CELLS

(71) Applicants: Gang Shi, Carbondale, IL (US); Hang Cek Liong, Singapore (SG); Jeevan Sivaraman, Singapore (SG)

(72) Inventors: Gang Shi, Carbondale, IL (US); Hang Cek Liong, Singapore (SG); Jeevan Sivaraman, Singapore (SG); Weng Kee Loh, Singapore (SG); Bo Zhang, Singapore (SG)

(73) Assignee: Gang Shi, Chicago, IL (US)

( * ) Notice: Subject to any disclaimer, the term of this patent is extended or adjusted under 35 U.S.C. 154(b) by 57 days.

(21) Appl. No.: 16/464,314

(22) PCT Filed: Dec. 5, 2017

(86) PCT No.: PCT/US2017/064625
§ 371 (c)(1),
(2) Date: May 28, 2019

(87) PCT Pub. No.: WO2018/106639
PCT Pub. Date: Jun. 14, 2018

(65) Prior Publication Data
US 2019/0386164 A1 Dec. 19, 2019

Related U.S. Application Data

(60) Provisional application No. 62/431,644, filed on Dec. 8, 2016.

(51) Int. Cl.
*H01L 31/05* (2014.01)
*H01L 31/02* (2006.01)
(Continued)

(52) U.S. Cl.
CPC .......... *H01L 31/0512* (2013.01); *C09J 5/00* (2013.01); *H01L 31/0201* (2013.01); *H01L 31/1876* (2013.01)

(58) Field of Classification Search
CPC . H01L 31/0201; H01L 31/042; H01L 31/048; H01L 31/0481; H01L 31/0504;
(Continued)

(56) References Cited

U.S. PATENT DOCUMENTS 6,166,322 A * 12/2000 Chen ................... H01L 31/048
136/244
9,484,484 B2 11/2016 Morad
(Continued)

FOREIGN PATENT DOCUMENTS

| JP | 2009130193 A | * | 6/2009 | | |
| WO | WO-0184638 A2 | * | 11/2001 | ......... | H01L 31/1876 |
| WO | WO-2017117136 A1 | * | 7/2017 | ......... | H01L 31/0504 |

OTHER PUBLICATIONS

JP 2009130193A English machine translation (Year: 2009).*
WO 0184638A2 English machine translation (Year: 2001).*

*Primary Examiner* — Andrew J Golden (57) ABSTRACT

A technique for interconnecting PV cells using partial overlapping method is disclosed with at least one part of the PV cell is applied with a non-conductive bonding material. Another PV cell is then placed above this PV cell in a partial overlapping manner and depending on the type of bonding material used, the necessary curing step is performed. The disclosed method can be used to interconnect 1) PV cells; 2) shingled PV strings; 3) PV cell and other components to external circuitry, within a shingled PV module. The interconnecting method also improves the aestheticism, reliability, and manufacturability of shingled PV modules that are constructed with shingled PV cells.

4 Claims, 14 Drawing Sheets (51) Int. Cl.
*H01L 31/18* (2006.01)
*C09J 5/00* (2006.01)

(58) Field of Classification Search
CPC ............. H01L 31/0508; H01L 31/0512; H01L 31/1876; H01L 31/188; H01L 31/043
USPC ........................................................ 136/246
See application file for complete search history.

(56) References Cited

U.S. PATENT DOCUMENTS

| | | | | |
|---|---|---|---|---|
| 2012/0125391 | A1* | 5/2012 | Pinarbasi | H01L 31/0504 |
| | | | | 136/244 |
| 2013/0112239 | A1* | 5/2013 | Liptac | H01L 31/048 |
| | | | | 136/246 |
| 2013/0152996 | A1* | 6/2013 | DeGroot | H01L 31/0508 |
| | | | | 136/244 |
| 2013/0206213 | A1 | 8/2013 | He | |
| 2015/0349703 | A1* | 12/2015 | Morad | H01L 31/0201 |
| | | | | 136/251 |
| 2017/0162736 | A1* | 6/2017 | Sethi | H01L 31/0504 |

\* cited by examiner

METHOD OF INTERCONNECTING SHINGLED PV CELLS

BACKGROUND OF THE INVENTION

In a typical conventional PV module, the PV cells are electrically connected in serial or parallel via conductive ribbons to form a PV string array. The common method of connecting these PV cells is through soldering process, referred to as tabbing and stringing. Once a PV string array is formed, the ribbons of individual PV strings are connected together by a module busbar to establish a circuit, thus completing the PV module electrical circuitry.

Where as in the case of a shingled PV module, one PV cell is partially overlapped onto another PV cell. During shingling process, the rear busbar contact area of a PV cell comes into contact with the front busbar contact area of another PV cell. This step can be repeated multiple times to form a PV string which are connected to each other to establish an electrical connection.

The cell overlapping process can be made possible by directly overlapping the busbars of the PV cells on top of each other to establish electrical connection, but the downside of this method is that these cells are susceptible to misalignment during the assembly process or post assembly process. When the position of these PV cells are not secured properly, any influence of external force, whether it is caused by equipment vibration, vacuum pick-up process or even finished product reliability testing phase, can greatly influence the positioning of the PV cells assembly. In some instances, intermediary conductive materials with adhesion properties are introduced between the busbars to provide a more reliable connection, both mechanically and electrically, but with the introduction of these materials, the risk of electrical shorting, which leads to catastrophic field failures is more eminent. The intermediary conductive materials which are introduced between the busbars tends to squeeze out of the overlapping region as a result of compression between two flat busbar surfaces during shingling process. This leads to PV cell shunting, hotspot failures and other reliability issues. These intermediary conductive materials are normally manufactured with conductive particles and filler materials. To ensure the electrical resistance is kept low, the typical choice for conductive particles is silver. With these materials being added into the PV module manufacturing process, the downside of this is cost is increased significantly.

SUMMARY OF THE INVENTION

Embodiments of the present disclosure generally relate to the method of interconnecting shingled PV cells. More particularly, embodiments of the subject matter relate to techniques for interconnecting shingled PV cells in a reliable manner, without the introduction of any intermediary conductive materials which include, but not limited to: 1) Solder paste; 2) Electrically Conductive Adhesive (ECA); 3) Solder ribbons. The present invention discloses a method to interconnect PV cells in a shingled manner with the introduction of non-conductive bonding material, whereby the non-conductive bonding material is applied around the overlapping region of the PV cells. The PV cells assembly is then cured using various curing techniques until the bonding material is cured. Once the bonding material is cured, the PV cells which are interconnected to form into a PV string are now electrically interconnected and its position is secured firmly by the bonding material. Moreover, the bonding material used in the present invention is electrically non-conductive in nature. This eliminates the risk of electrical shorting completely, even when there is excessive material squeeze out. As an added advantage, the cost for non-conductive materials are significantly lower than electrically conductive materials.

According to a first aspect of the invention, a method of interconnecting two shingled PV cells is provided, comprising: Step 1: placing a PV cell on a flat surface; Step 2: applying non-conductive bonding material on the surface of the PV cell; Step 3: placing another PV cell in a partial overlapping manner, such that the busbars of both PV cells comes into contact with each other; and Step 4: curing the PV cells assembly. The variation in curing methods used in this invention includes; 1) Heat curing technique; 2) Ultraviolet (UV) exposure curing technique; 3) Contact and non-contact force application technique.

According to a second aspect of the invention, a method of interconnecting two shingled PV cells is provided, comprising: Step 1: placing a PV cell on a flat surface; Step 2: placing another PV cell in a partial overlapping manner, such that the busbars of both PV cells comes into contact with each other; Step 3: applying non-conductive bonding material on the edge of the PV cell; and Step 4: curing the PV cells assembly. The variation in curing methods used in this invention includes; 1) Heat curing technique; 2) Ultraviolet (UV) exposure curing technique; 3) Contact and non-contact force application technique.

According to a third aspect of the invention, a method of interconnecting two shingled PV cells is provided, comprising: Step 1: placing a PV cell on a flat surface; Step 2: applying non-conductive bonding material on the surface of the PV cell; Step 3: placing another PV cell in a partial overlapping manner, such that the busbars of both PV cells comes into contact with each other; Step 4: applying non-conductive bonding material on the edge of the PV cell; and Step 5: curing the PV cells assembly. The variation in curing methods used in this invention includes; 1) Heat curing technique; 2) Ultraviolet (UV) exposure curing technique; 3) Contact and non-contact force application technique.

This method of interconnection includes, but not limited to: 1) to establish connection between PV cells; 2) to establish connection between shingled PV strings; 3) to establish connection between PV cell and other components; 4) to establish connection to external circuitry, within a shingled PV module.

This interconnection method can be used to establish series, parallel and a combination of series and parallel circuit design construction.

The bonding material type and application volume is selected to provide reliable mechanical strength without jeopardizing the electrical connections. The bonding material is electrically non-conductive. The bonding material includes, but not limited to: 1) Epoxy based; 2) Gel based; 3) Tape based. The region of application includes, but not limited to: 1) Front side of PV cell; 2) Rear side of PV cell; 3) Edges of PV cell.

DETAILED DESCRIPTION

Certain terminology may also be used in the following description for the purpose of reference only, and thus are not intended to be limiting. For example, terms such as "top", "bottom", "upper", "lower", "above", and "below" refer to internally consistent directions in the drawings to which reference is made. Terms such as "front", "back", "rear", "side" may describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Photovoltaic"—Photovoltaic, or PV in short, may refer to the conversion of light into electricity using semiconductor materials that exhibit photovoltaic effect. Photovoltaic cells and photovoltaic modules can also be regarded as solar cells and solar modules.

"Photovoltaic Cell"—Photovoltaic cell, or PV cell in short, may refer to the semiconductor material that exhibit photovoltaic effect that converts light into electricity. Photovoltaic cells can also be regarded as solar cells.

"Photovoltaic Module"—Photovoltaic module, or PV module in short, may constitute PV cells which are interconnected and are encapsulated into an assembly that generates solar electricity. Photovoltaic modules can also be regarded as solar modules or solar panels.

Figure 14:
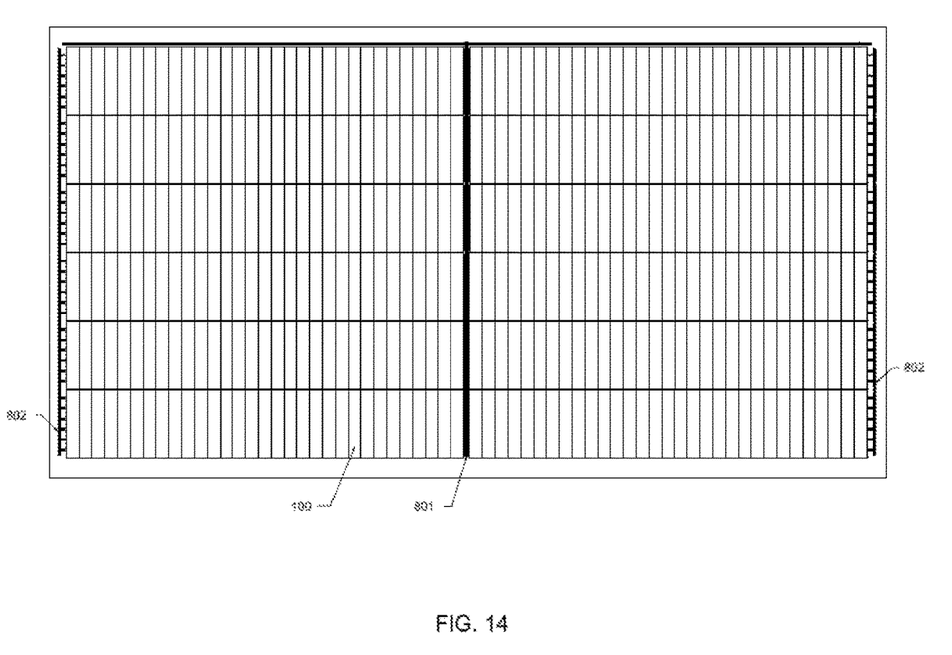
FIG. 14 shows an example of an overall PV module schematic diagram.

"Shingled"—Shingled may refer to Photovoltaic cells which are shingled together. Shingled may refer to a PV cell which is partially overlapped onto another PV cell. During shingling process, the back busbar contact area of a PV cell comes into contact with the front busbar contact area of another PV cell. FIG. 14 shows an example of a PV module schematic diagram constructed with shingled PV cells.

"String"—String may refer to two or more Photovoltaic cells that are connected in series to form a chain or a string of PV cells.

"Busbar"—Busbar or bus bar may refer to a conductive element or electrode which is printed on the front and rear of a PV cell. The purpose of a busbar is to conduct the direct current produced by the PV cell from the incoming photons. Busbars are used to conduct electric current from grid fingers, neighboring PV cells and/or external circuitry.

Figure 1:
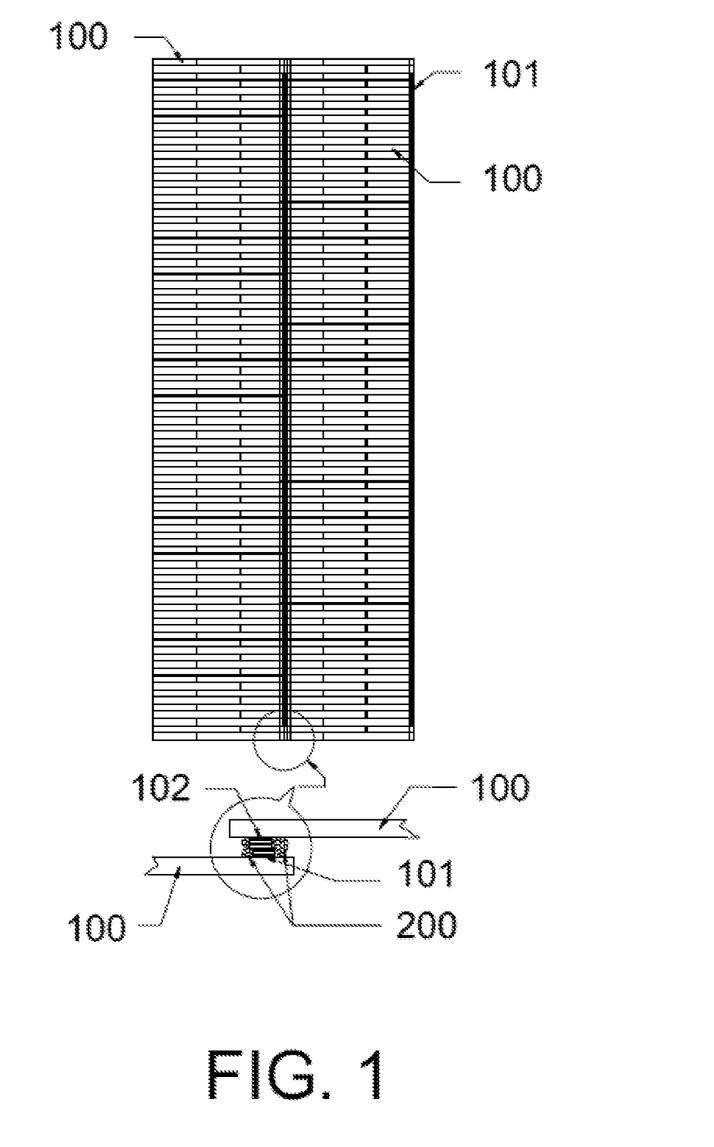
FIG. 1 shows a top and side plan view of an example of two shingled PV cells which are interconnected in an overlapping manner.

FIG. 1 illustrates an example of two PV cells 100 that are interconnected in a partial overlapping manner. The present invention details out the method for interconnecting two shingled PV cells 100 by coupling the front side busbars 101 of a PV cell with the rear side busbars 102 of another PV cell and using non-conductive bonding material 200 at the overlapping regions to hold the PV cells in position. This interconnecting method also includes, but not limited to: 1) to establish connection between PV cells; 2) to establish connection between shingled PV strings; 3) to establish connection between PV cell and other components; 4) to establish connection to external circuitry, within a shingled PV module.

Figure 2:
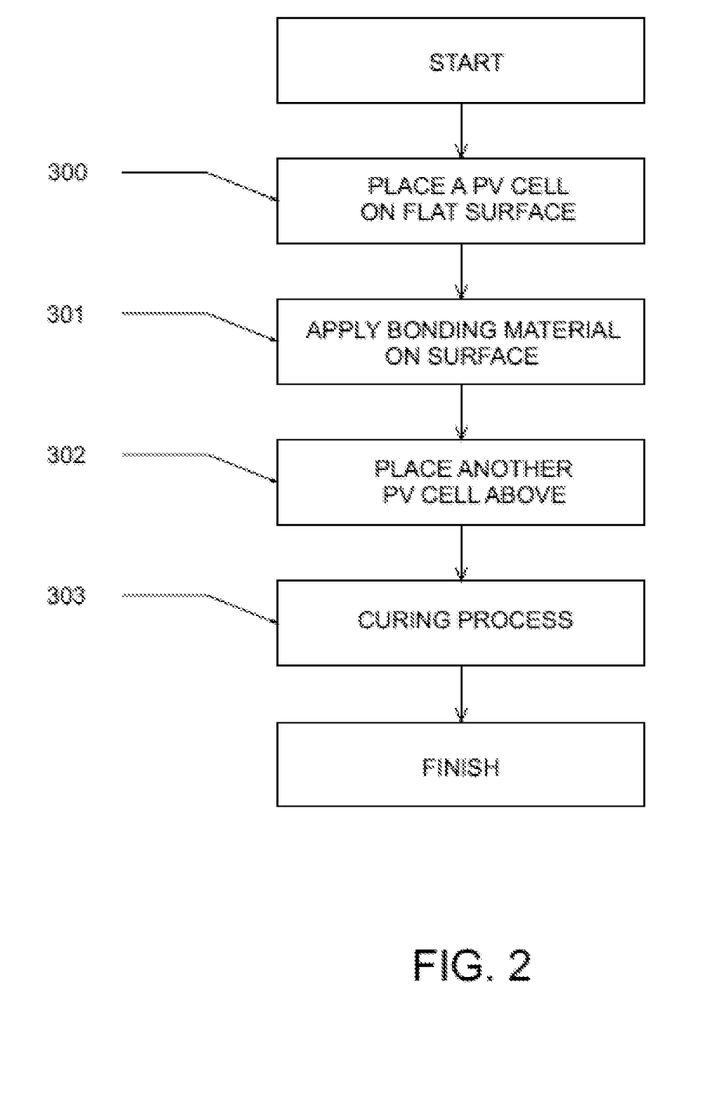
FIG. 2 shows a flowchart diagram of an example of a method of interconnecting 2 shingled PV cells.

FIG. 2 shows a flowchart diagram of an example of a method of interconnecting two shingled PV cells. A brief description of FIG. 2 flowchart includes placing a PV cell on a flat surface 300, applying a non-conductive bonding material on the surface of the PV cell 301, placing another PV cell above in a partial overlapping manner, such that the busbars of both PV cells comes into contact with each other 302 and curing the PV cells assembly 303.

Figure 3:
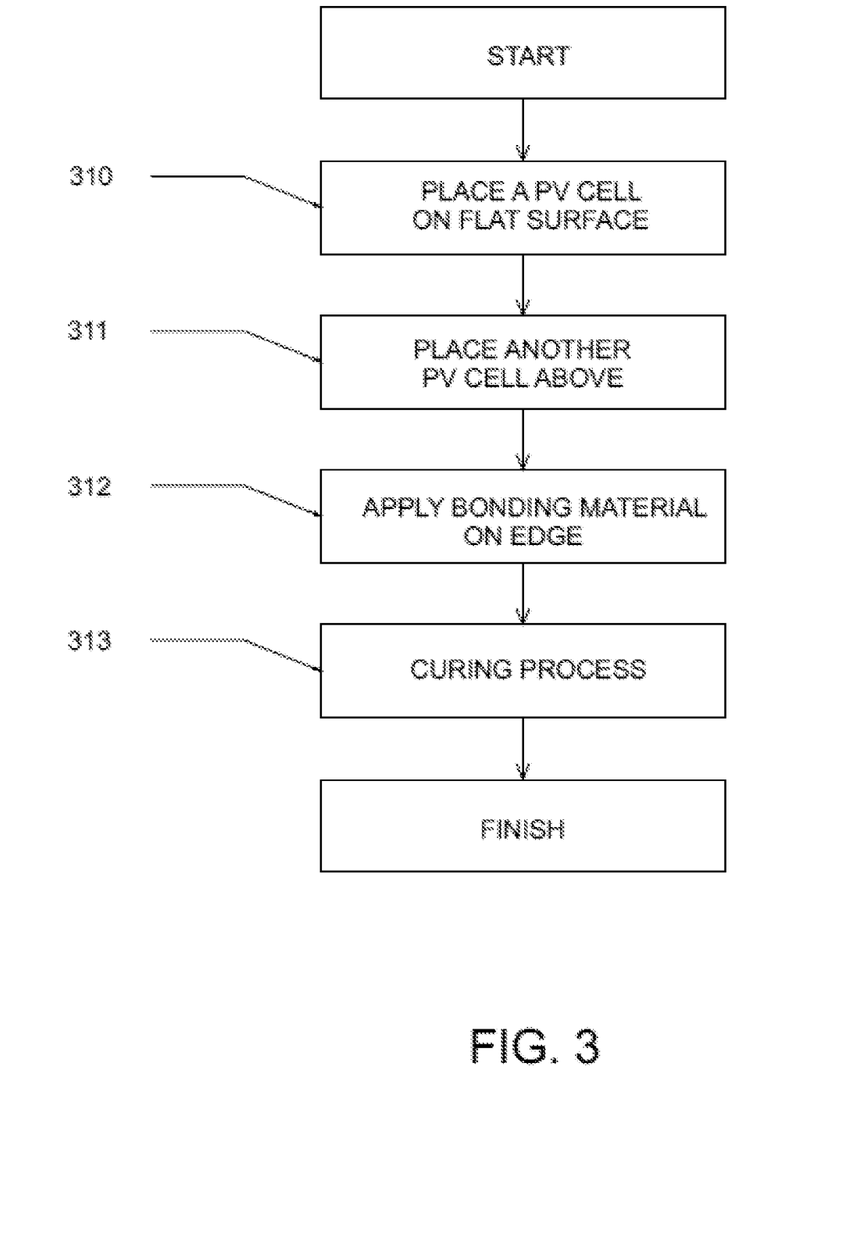
FIG. 3 shows a flowchart diagram of another example of a method of interconnecting 2 shingled PV cells.

FIG. 3 shows a flowchart diagram of another example of a method of interconnecting two shingled PV cells. A brief description of FIG. 3 flowchart includes placing a PV cell on a flat surface 310, placing another PV cell above in a partial overlapping manner, such that the busbars of both PV cells comes into contact with each other 311, applying a non-conductive bonding material on the edge of the PV cell 312, and curing the PV cells assembly 313.

Figure 4:
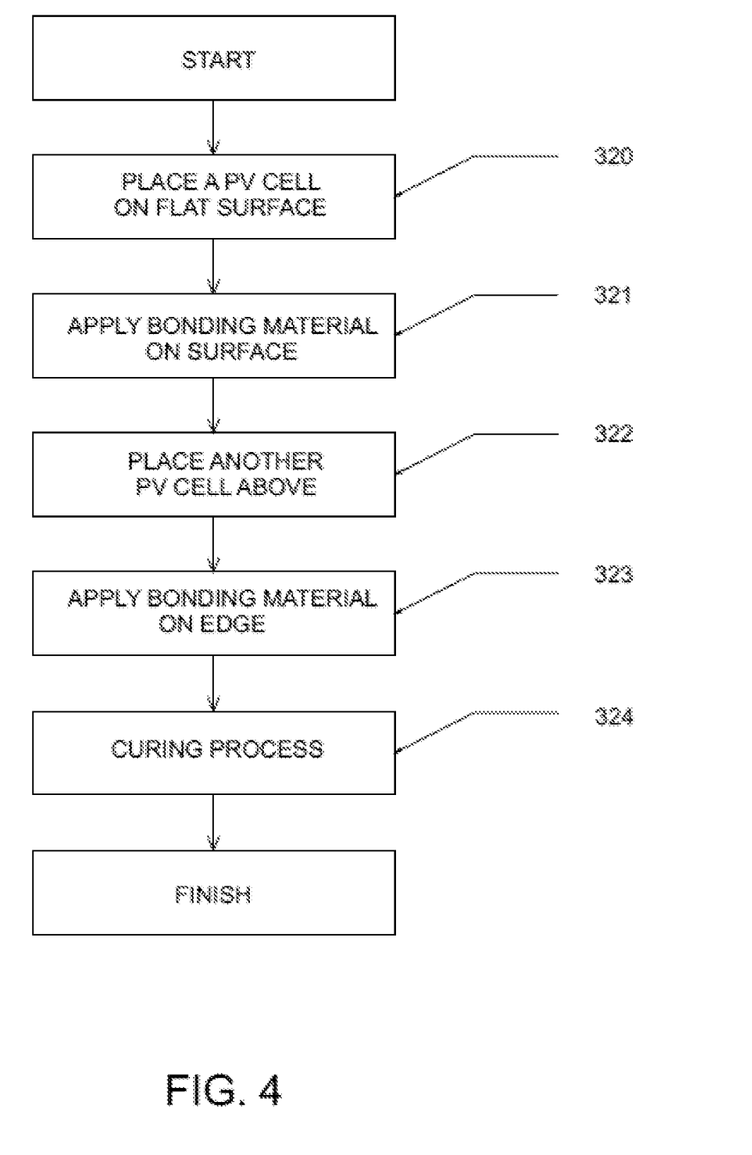
FIG. 4 shows a flowchart diagram of another example of a method of interconnecting 2 shingled PV cells.

FIG. 4 shows a flowchart diagram of another example of a method of interconnecting two shingled PV cells. A brief description of FIG. 4 flowchart includes placing a PV cell on a flat surface 320, applying a non-conductive bonding material on the surface of the PV cell 321, placing another PV cell above in a partial overlapping manner, such that the busbars of both PV cells comes into contact with each other 322, applying a non-conductive bonding material on the edge of the PV cell 323, and curing the PV cells assembly 324.

The following descriptions below details out the step by step process and components used to perform the various tasks elaborated in the flowcharts of FIGS. 2-4. The various tasks performed in FIGS. 2-4 may be performed by manual human intervention, standalone equipment, fully automatic equipment or any combination thereof. For illustrative purposes, the descriptions mentioned in FIGS. 2-4 may refer to elements mentioned in connection with FIGS. 5-13.

Figure 5:
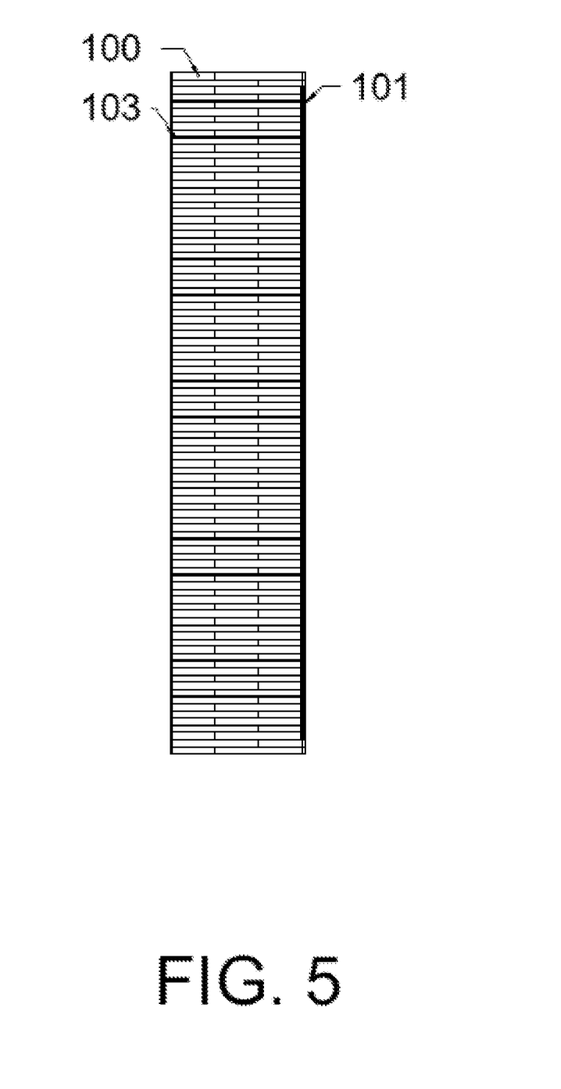
FIG. 5 shows a top plan view of an example of a PV cell.

FIG. 5 shows a top plan view of an example of a PV cell. The PV cell 100 includes a front cell busbars 101, along with fingers 103 disposed on the top surface of a silicon substrate.

Figure 6:
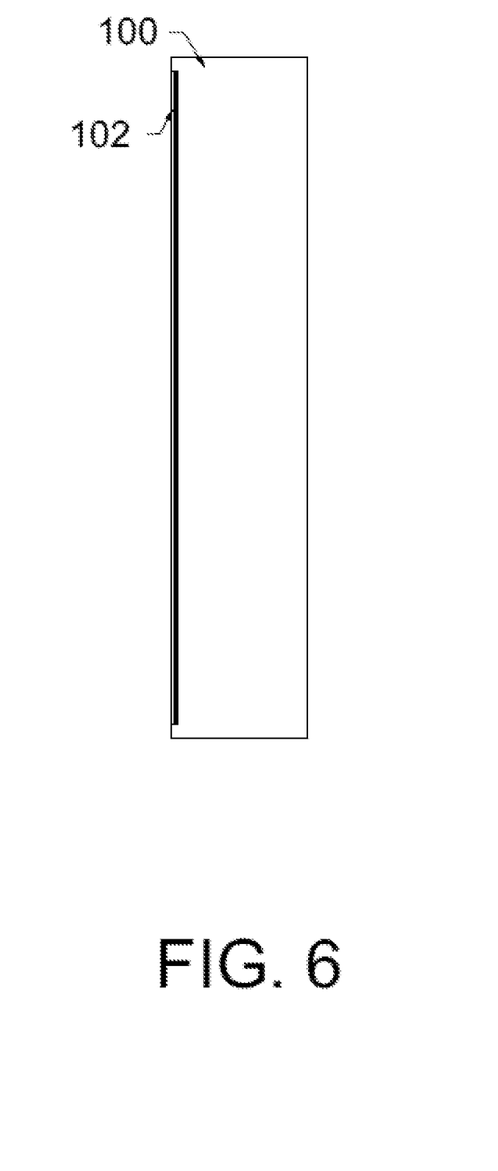
FIG. 6 shows a bottom plan view of the same PV cell in FIG. 5.

FIG. 6 shows a bottom plan view of the same PV cell 100 as shown in FIG. 5. It is shown a rear cell busbars 102, disposed on the surface of a silicon substrate.

Figure 7:
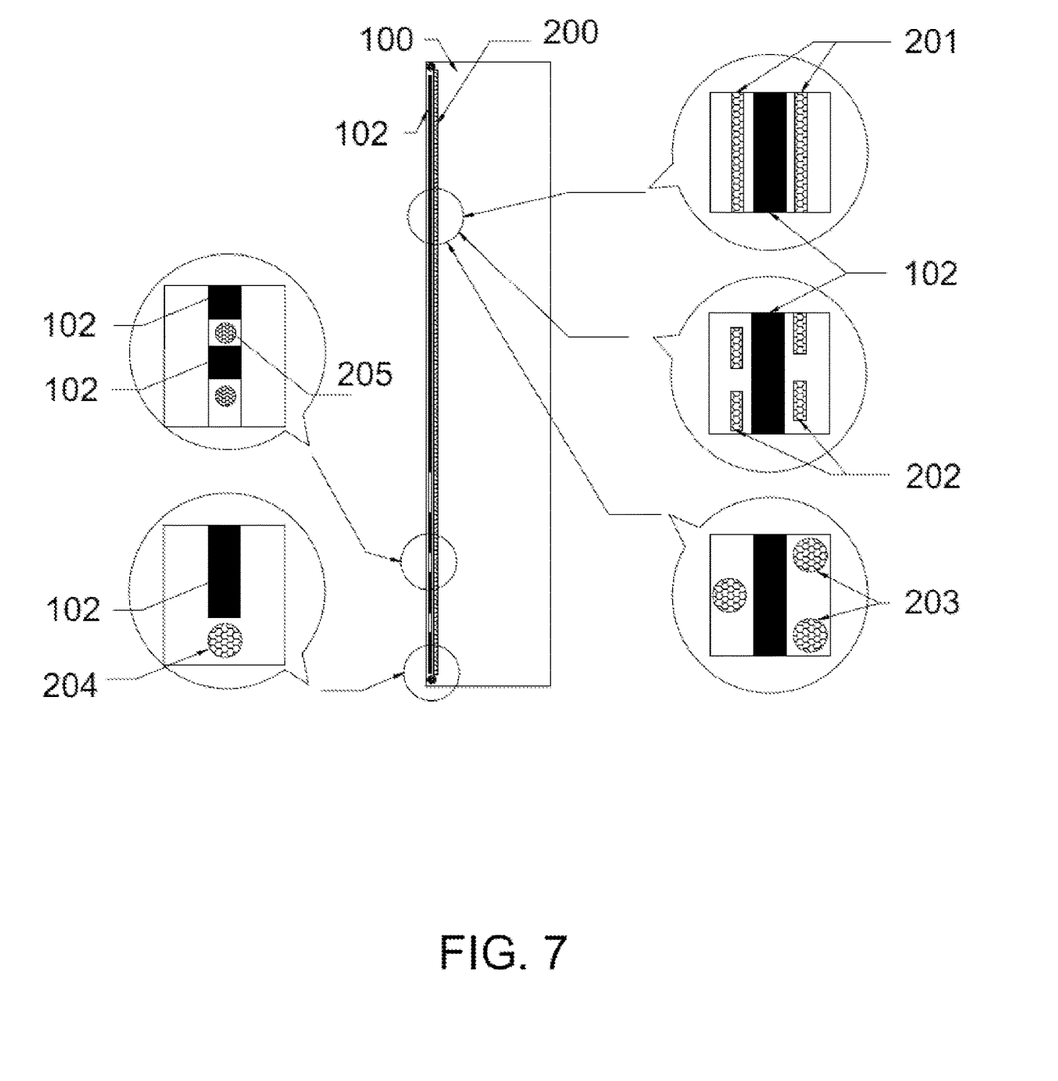
FIG. 7 shows a top plan view of an example of the non-conductive bonding material applied to a PV cell.

FIG. 7 illustrates a bottom plan view of an example of a PV cell 100 with non-conductive bonding material 200 applied on the PV cell. The non-conductive bonding material can be applied on any location within the PV cell, irrespective of front surface of PV cell, rear surface of PV cell, edges of PV cell, or any combination thereof. For illustrative purposes, the example in FIG. 7 details out the process of non-conductive bonding material application on the rear surface of PV cell, particularly on the overlapping regions, along the rear busbars of the PV cell 102.

The selection of non-conductive bonding material depends on multiple factors, such as impact to electrical connectivity, mechanical strength, impact to product reliability, application compatibility, cost and several other factors. Though the main purpose of the non-conductive bonding material is to hold PV cells together, the type of bonding material that is used for this application have adequate adhesion to mechanically hold PV cells together and has properties to ensure it is compatible with the fabrication process, chemically inert to the other components in contact, and stable over time and operation temperature to meet the reliability requirements of PV modules. The choices of bonding material type includes, but not limited to; epoxy based, gel based and can be in the form of paste, liquid, tape, film, etc. The bonding material is electrically non-conductive.

The application method includes, but not limited to; syringe or nozzle spray dispensing of liquid based bonding material, stencil based application for paste based bonding material or pick and place method for tape and film based bonding material. The application pattern and volume is best suited for ideal balance between performance, reliability and cost. The typical application pattern includes, but not limited to; continuous line application 201, segmented line application 202, segmented dot application 203, or any combination thereof.

The typical application region for the non-conductive bonding material is within the overlapping region. The bonding material can be applied at areas which includes, but not limited to; along the edges of the PV cell, parallel to the long edge of busbars 102, as shown in FIG. 7 example 201, perpendicular to the busbars 102, shown as 204, in between busbars that are segmented, shown as 205 or any combination thereof.

Figure 8:
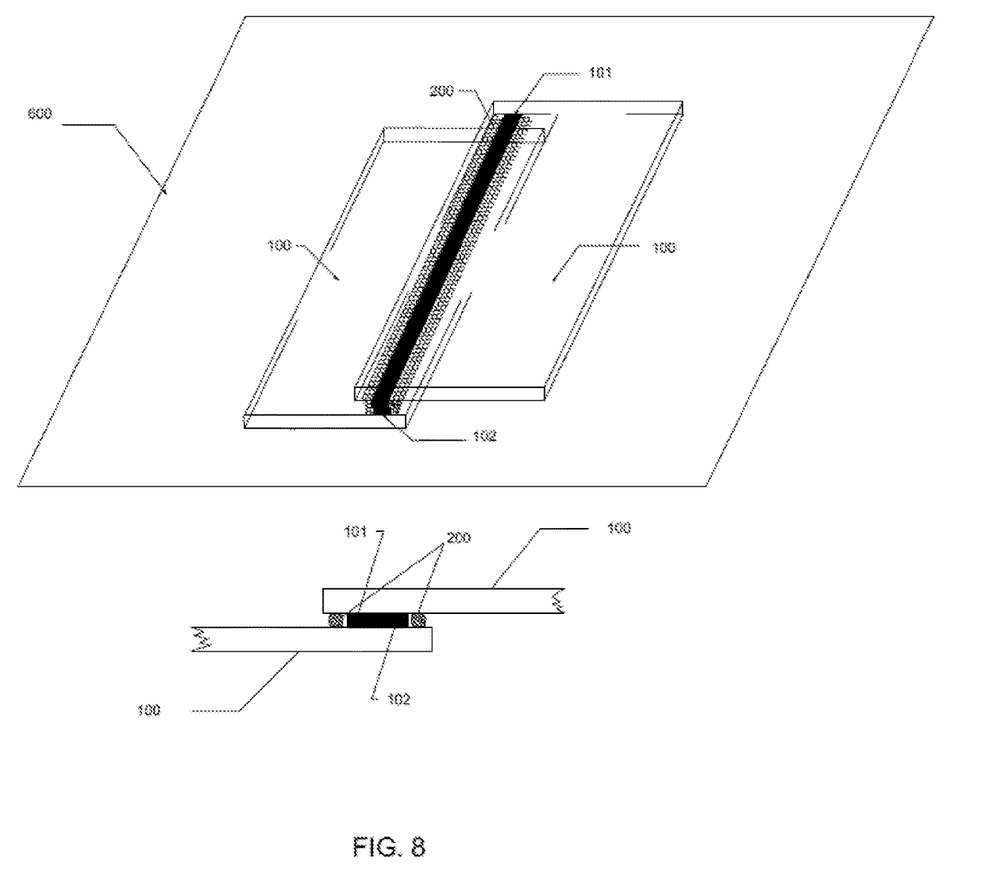
FIG. 8 shows a perspective view of an example of two PV cells interconnected in a partial overlapping manner.

FIG. 8 shows a perspective view and a side view of an example of two PV cells 100 interconnected in a partial overlapping manner. The step by step procedures to complete the interconnection procedure is referenced to the flowchart shown in FIG. 2. The detailed steps are as follows; Step 1: placing a PV cell 100 on a flat surface 600 such that the rear side of the PV cell is facing upwards; Step 2: applying non-conductive bonding material 200 on the rear surface of the PV cell, along the rear busbar 102 in a continuous line pattern, whereby the non-conductive bonding material is applied at a distance between 0.1 mm to 1.0 mm away from the edge of the busbar; Step 3: placing another PV cell in a partial overlapping manner, such that the front busbar 101 of the top PV cell is aligned to the rear busbar 102 of the bottom PV cell, whereby electrical contact is established between these PV cells; Step 4: curing the PV cells assembly. Once the PV cells assembly is cured, the non-conductive bonding material is contained within the overlapping region only.

Figure 9:
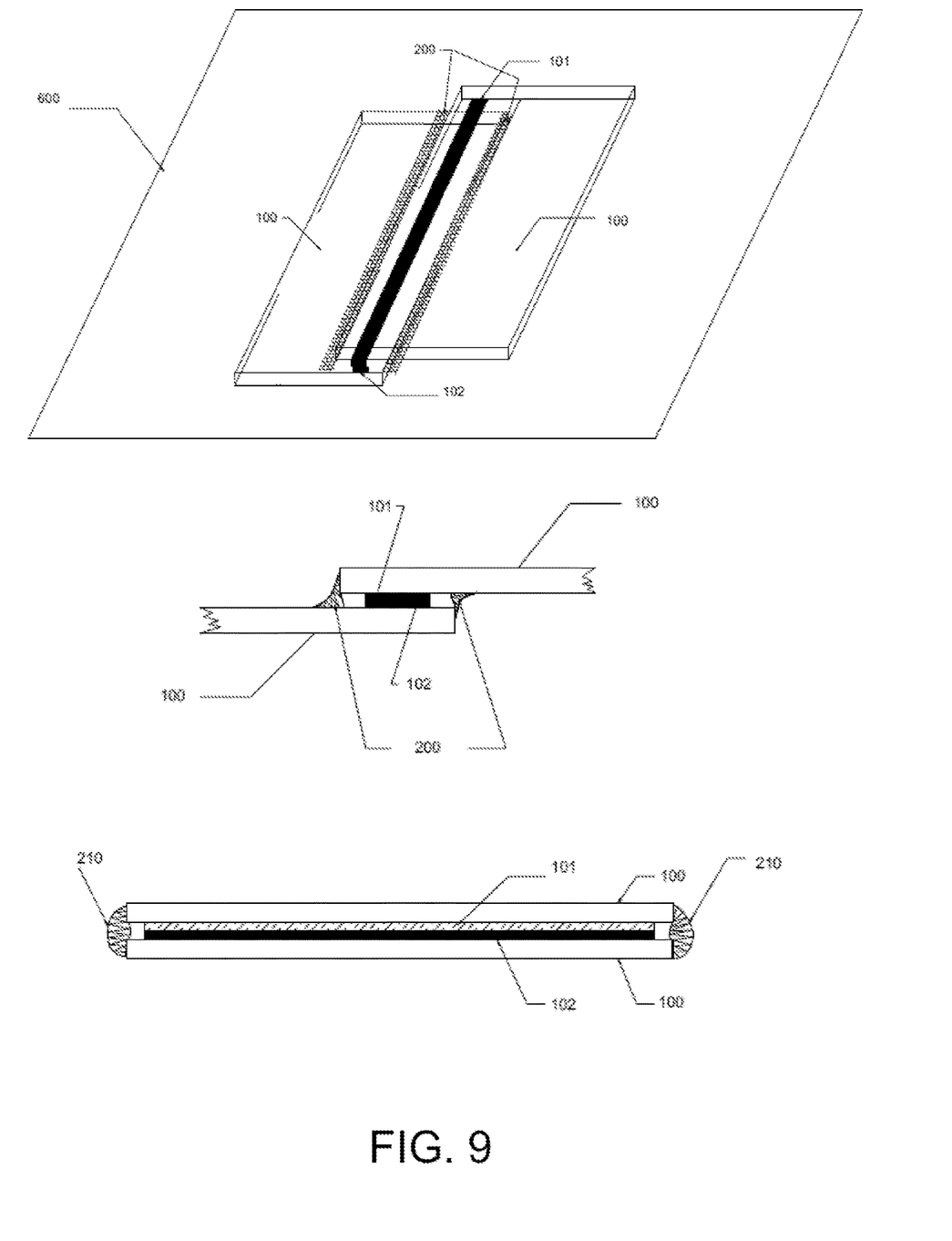
FIG. 9 shows a perspective view of another example of two PV cells interconnected in a partial overlapping manner.

FIG. 9 shows a perspective view, a side view and a front view of another example of two PV cells 100 interconnected in a partial overlapping manner. The step by step procedures to complete the interconnection procedure is referenced to the flowchart shown in FIG. 3. The detailed steps are as follows; Step 1: placing a PV cell 100 on a flat surface 600 such that the rear side of the PV cell is facing upwards; Step 2: placing another PV cell in a partial overlapping manner, such that the front busbar 101 of the top PV cell is aligned to the rear busbar 102 of the bottom PV cell, whereby electrical contact is established between these PV cells; Step 3: applying non-conductive bonding material 200 on the edge of the PV cells which are overlapped; and Step 4: curing the PV cells assembly.

The example shown in FIG. 9 is another method of applying non-conductive bonding material to the PV cells assembly. In this method, the non-conductive bonding material is applied on the edge surface only after once the PV cells overlapping process has completed. The non-conductive bonding material can be applied from the top and/or bottom direction of the PV cell along the direction of the long edge of the PV cell 200 and/or can be applied on the short edge surfaces 210 of the PV cells.

Figure 10:
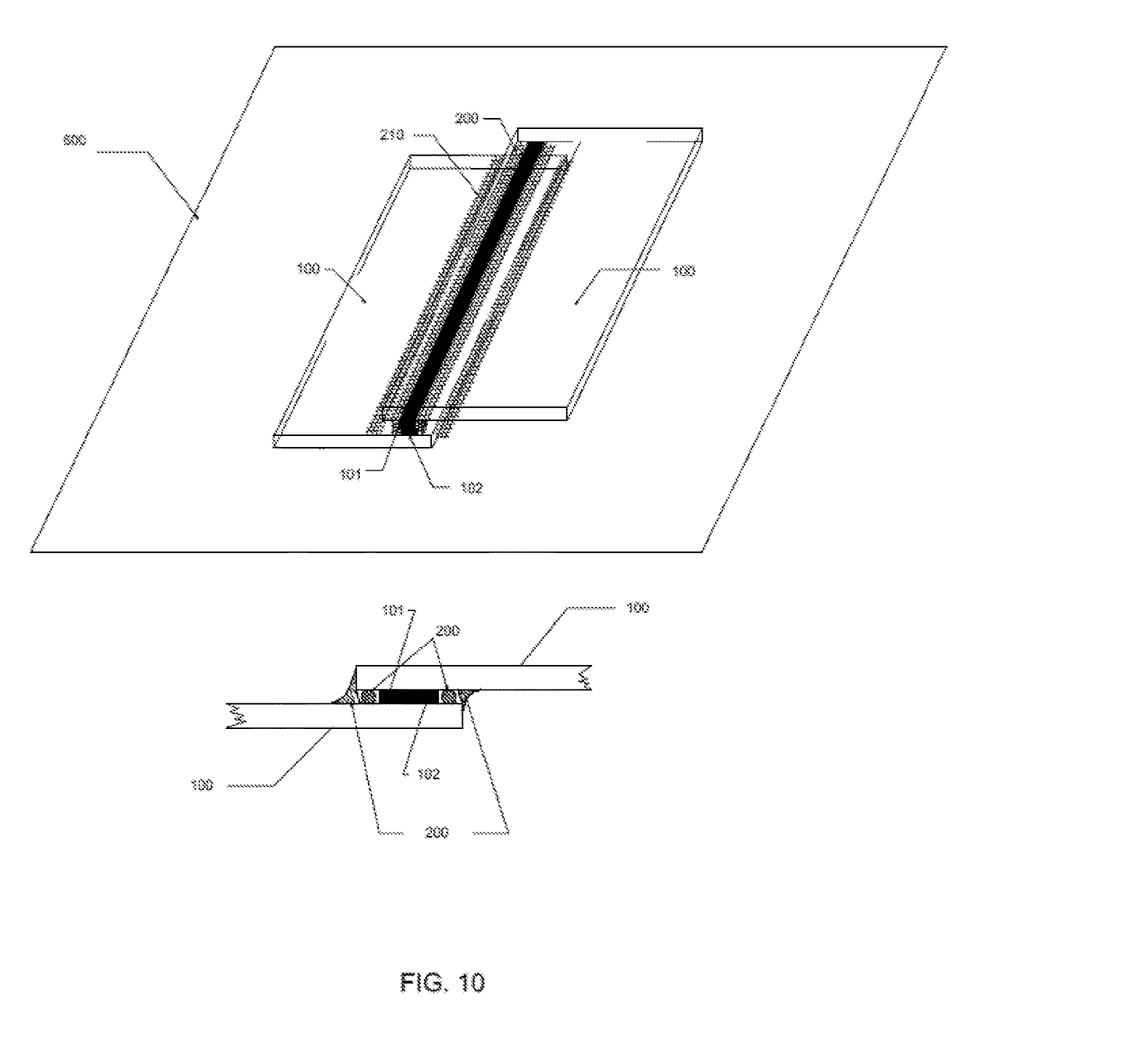
FIG. 10 shows a perspective view of another example of two PV cells interconnected in a partial overlapping manner.

FIG. 10 shows a perspective view and a side view of another example of two PV cells 100 interconnected in a partial overlapping manner. The step by step procedures to complete the interconnection procedure is referenced to the flowchart shown in FIG. 4. The detailed steps are as follows; Step 1: placing a PV cell 100 on a flat surface 600 such that the rear side of the PV cell is facing upwards; Step 2: applying non-conductive bonding material 200 on the rear surface of the PV cell, along the rear busbar 102 in a continuous line pattern whereby the non-conductive bonding material is applied at a distance between 0.1 mm to 1.0 mm from the edge of the busbar; Step 3: placing another PV cell in a partial overlapping manner, such that the front busbar 101 of the top PV cell is aligned to the rear busbar 102 of the bottom PV cell, whereby electrical contact is established between these PV cells; Step 4: applying non-conductive bonding material on the edge of the PV cells which are overlapped 200, along the long edge of the PV cells; and Step 5: curing the PV cells assembly.

Various curing methods are available for different bonding material types. Depending on the type of design and application, the type of curing technique must be selected based on the bonding material that is selected for the particular application. Due to its physical structure, PV cells are delicate in nature. Curing method without the use of excessive contact and pressure, such as exposure to air, moisture, heat and Ultraviolet (UV) light curing is much preferred for interconnected shingled PV cells. This factor is a key consideration to determine the bonding material selection. A successful cured connection should have the bonding material securely holding the PV cells together and still allow effective electrical coupling between the busbars by ensuring adequate busbar to busbar contact area.

Figure 11:
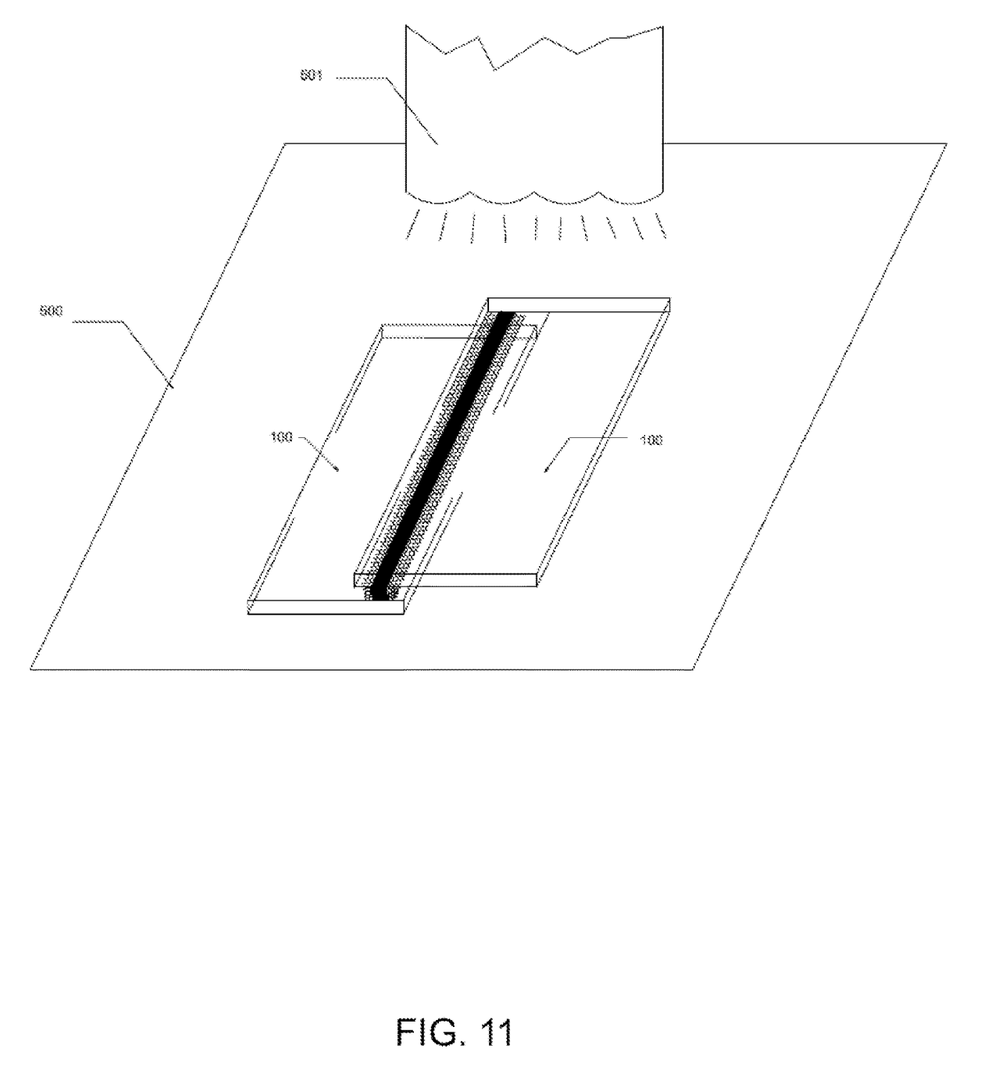
FIG. 11 shows an example of two partially overlapped PV cells undergoing heat curing process.

FIG. 11 shows an example of two partially overlapped PV cells 100 undergoing heat curing process. During the heat curing process, the partially overlapped PV cells are placed on a heated surface 500 for a certain duration. The temperature range primarily depends on the curing properties of the non-conductive bonding material, and it can be within the ambient room temperature, which is within 15-25 degrees Celsius, and up to 250 degree Celsius. This method of heat curing is regarded as direct conduction heat curing. Other methods for heat curing includes, but not limited to; infra-red heat curing, bump-coil heat curing, convection heat curing, whereby heat is applied on the PV cells assembly without any contact by a heat source 501.

Figure 12:
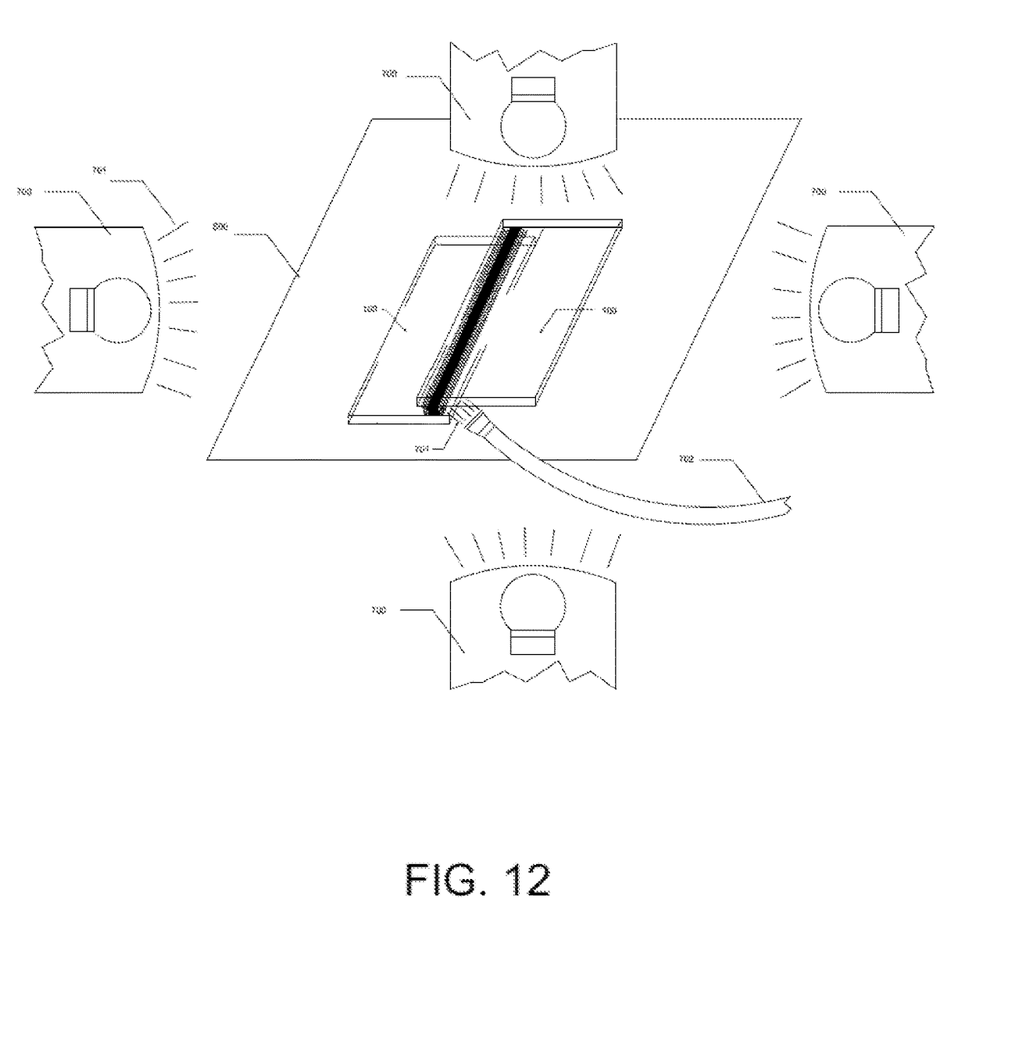
FIG. 12 shows an example of two partially overlapped PV cells undergoing UV curing process.

FIG. 12 shows an example of two partially overlapped PV cells 100 undergoing Ultraviolet (UV) light 701 curing process. During the UV light curing process, the partially overlapped PV cells are placed on a surface which is transparent or non-transparent 600 and are exposed to UV light source 700. In this example, the UV light source is from a UV bulb which is mounted at four different locations. There is also a light tube 702 which emits focused beam of UV light at the locations where the non-conductive bonding material is applied. The wavelength of the UV light used in this application is within the range of 10 nm to 400 nm and the intensity of the UV light is within the range of 300-20000 mW/m2. The duration of the curing process is dependent on the non-conductive bonding material type which is selected for the particular application.

Figure 13:
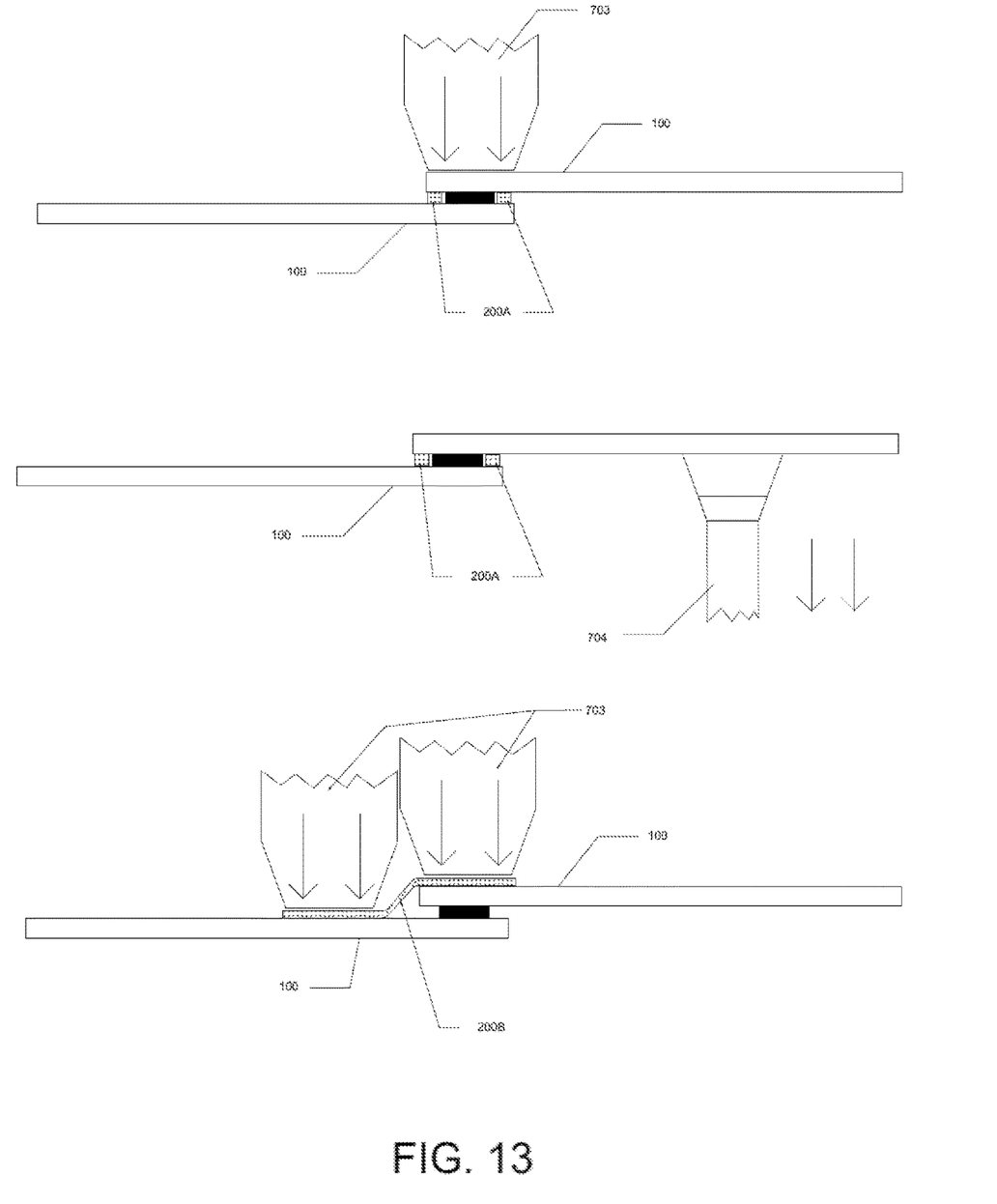
FIG. 13 shows an example of two partially overlapped PV cells undergoing curing process which requires force.

FIG. 13 shows an example of two partially overlapped PV cells 100 undergoing curing process whereby force within the range of 10 mN-9.8N is applied above and/or below the region where the non-conductive bonding material is applied. In one example, the non-conductive bonding material which is used is of a semi-solid gel based material 200A. Force is applied using a contact tool 703 from a direction which is directly above the PV cells assembly overlapping region. The force can also be applied indirectly, as shown in another example whereby vacuum suction 704 is applied on the PV cells assembly. This vacuum suction exerts substantial force to hold the PV cells assembly down firmly in place during curing process. In another example, the non-conductive bonding material which is used is of a film or tape based material 200B. Force is applied using a contact tool 703 from a direction which is directly above the PV cells assembly.

Depending on the selection of the non-conductive bonding material for this application, certain bonding materials can have a combination of multiple curing methods to achieve desirable results. Therefore, one or more curing methods described in FIGS. 11-13 can be applied at any given time, whether in a single step, or multi profiled curing steps.

FIG. 14 shows an example of an overall PV module schematic diagram that is constructed using methods specified in FIGS. 8-10 or any combination thereof. The method of interconnecting shingled PV cell, which is the present invention is used to establish connection; 1) between PV cells 100; 2) between shingled PV strings using a specifically designed ribbon 802; 3) between PV cells and other circuitry components 801.

While the foregoing written description of the invention enables one of ordinary skill to make and use what is considered presently to be the best mode thereof, those of ordinary skill will understand and appreciate the existence of variations, combinations, and equivalents of the specific embodiments, method, and examples herein. The invention should therefore not be limited by the above described embodiments, method, and examples, but by all embodiments and methods within the scope and spirit of the invention.

What is claimed is:

1. A PV string comprising a first and second PV cells, each PV cell having a busbar, wherein the first and second PV cells are electrically connected to each other using non-conductive bonding material, characterised in that the first and second PV cells are interconnected in a partial overlapping manner, and the non-conductive bonding material is within the overlapping regions of the first and second PV cells, and forms a direct connection between the busbar of the first and the busbar of the second PV cells and without the use of conductive bonding material.

2. A method of electrically connecting and constructing the PV string according to claim 1, comprising the steps of:
Step 1: applying the non-conductive bonding material on a surface of the first and/or the second PV cell, wherein the non-conductive bonding material is applied along a region adjacent to a front busbar edge of the first PV cell and/or along a region adjacent to a rear busbar edge of the second PV cell;
Step 2: placing the second PV cell in a partially overlapping manner, such that the busbars of both the first and second PV cells are aligned with each other, and the non-conductive bonding material is within the overlapping region of the first and second PV cells, characterized in that a mechanical connection is established by direct contact of the non-conductive bonding material to the first and second PV cell such that an electrical contact between the first and second PV cells is established;
Step 3: curing the PV string.

3. The method according to claim 2, wherein the non-conductive bonding material is applied in a continuous or non-continuous manner.

4. The method according to claim 3, wherein the non-conductive bonding material is applied using a means selected from a group consisting of a syringe, a spray nozzle, a stencil or a pick and place process step.

* * * * *